US010734499B2

(12) United States Patent
Cai et al.

(10) Patent No.: US 10,734,499 B2
(45) Date of Patent: *Aug. 4, 2020

(54) UNMERGED EPITAXIAL PROCESS FOR FINFET DEVICES WITH AGGRESSIVE FIN PITCH SCALING

(71) Applicants: INTERNATIONAL BUSINESS MACHINES CORPORATION, Armonk, NY (US); GLOBALFOUNDRIES INC., Cayman Islands (KY)

(72) Inventors: Xiuyu Cai, Niskayuna, NY (US); Kangguo Cheng, Schenectady, NY (US); Ali Khakifirooz, Los Altos, CA (US); Ruilong Xie, Niskayuna, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 200 days.

This patent is subject to a terminal disclaimer.

(21) Appl. No.: 15/986,031

(22) Filed: May 22, 2018

(65) Prior Publication Data

US 2018/0277648 A1 Sep. 27, 2018

Related U.S. Application Data

(63) Continuation of application No. 14/920,354, filed on Oct. 22, 2015.

(51) Int. Cl.
*H01L 29/66* (2006.01)
*H01L 29/06* (2006.01)
(Continued)

(52) U.S. Cl.
CPC ...... *H01L 29/6653* (2013.01); *H01L 21/2018* (2013.01); *H01L 21/3065* (2013.01);
(Continued)

(58) Field of Classification Search
CPC . H01L 27/0886; H01L 21/32; H01L 21/3085; H01L 21/3086; H01L 21/3088; H01L 21/027–0338; H01L 21/823431
See application file for complete search history.

(56) References Cited

U.S. PATENT DOCUMENTS

| 8,362,568 | B2 | 1/2013 | Lin et al. |
| 8,377,759 | B2 | 2/2013 | Cheng et al. |

(Continued)

OTHER PUBLICATIONS

Final Office Action for U.S. Appl. No. 15/343,776 dated Jan. 23, 2019 (9 pages).
M. Guillorn et al., "FinFET performance advantage at 22nm: An AC perspective," Symposium on VLSI Technology, Jun. 2008, pp. 12-13.

(Continued)

*Primary Examiner* — Brigitte A Paterson
(74) *Attorney, Agent, or Firm* — Tutunjian & Bitetto, P.C.

(57) ABSTRACT

Methods for forming a semiconductor device include forming a first spacer on a plurality of fins. A second spacer is formed on the first spacer, the second spacer being formed from a different material from the first spacer. Gaps between the fins are filled with a support material. The first spacer and second spacer are polished to expose a top surface of the plurality of fins. All of the support material is etched away after polishing the first spacer and second spacer. The plurality of fins is etched below a bottom level of the first spacer to form a fin cavity. Material from the first spacer is removed to expand the fin cavity. Fin material is grown directly on the etched plurality of fins to fill the fin cavity.

17 Claims, 4 Drawing Sheets

(51) Int. Cl.
| | |
|---|---|
| *H01L 29/78* | (2006.01) |
| *H01L 29/10* | (2006.01) |
| *H01L 21/3065* | (2006.01) |
| *H01L 21/308* | (2006.01) |
| *H01L 21/20* | (2006.01) |
| *H01L 21/3105* | (2006.01) |
| *H01L 21/8234* | (2006.01) |
| *H01L 27/088* | (2006.01) |

(52) U.S. Cl.
CPC ...... *H01L 21/3081* (2013.01); *H01L 21/3086* (2013.01); *H01L 21/31053* (2013.01); *H01L 21/823418* (2013.01); *H01L 21/823431* (2013.01); *H01L 27/0886* (2013.01); *H01L 29/0649* (2013.01); *H01L 29/1037* (2013.01); *H01L 29/6656* (2013.01); *H01L 29/66545* (2013.01); *H01L 29/66553* (2013.01); *H01L 29/66795* (2013.01); *H01L 29/785* (2013.01); *H01L 29/7853* (2013.01)

(56) References Cited

U.S. PATENT DOCUMENTS

| | | |
|---|---|---|
| 8,921,191 B2 | 12/2014 | Cai et al. |
| 8,981,493 B2 | 3/2015 | Cheng et al. |
| 9,418,897 B1 | 8/2016 | Ching et al. |
| 2014/0167162 A1 | 6/2014 | He et al. |
| 2014/0285980 A1 | 9/2014 | Cappellani et al. |
| 2015/0061015 A1 | 3/2015 | He et al. |
| 2015/0069527 A1 | 3/2015 | Kerber et al. |
| 2015/0069531 A1 | 3/2015 | Naczas et al. |
| 2015/0108544 A1 | 4/2015 | Ching et al. |

OTHER PUBLICATIONS

Basker et al., "A 0.063 µm2 FinFET SRAM cell demonstration with conventional lithography using a novel integration scheme with aggressively scaled fin and gate pitch," Symposium on VLSI Technology, Jun. 2010, pp. 19-20.

Office Action for U.S. Appl. No. 15/343,776 dated Apr. 30, 2018 (44 pages).

List of IBM Patents or Patent Applications Treated as Related dated May 22, 2018, 2 pages.

UNMERGED EPITAXIAL PROCESS FOR FINFET DEVICES WITH AGGRESSIVE FIN PITCH SCALING

BACKGROUND

Technical Field

The present invention relates to transistor fabrication and, more particularly, to fabrication of unmerged source/drain fin field effect transistors.

Description of the Related Art

Fin field effect transistors (FinFETs) are commonly employed in modern semiconductor devices due to their small size and ease of fabrication. During fabrication of such devices, the fins may have additional material added to them through epitaxial growth. Increasing the fin size in this manner can improve various electrical properties of the device, in particular by decreasing the device resistance. Epitaxial growth can be conducted to an arbitrary degree, and the decreased device resistance scales continuously with fin size.

However, conventional epitaxial growth processes face certain challenges. In one technique, the epitaxial growth continues until a line of parallel fins merge with one another. However, fins at the ends of the line will have a significant amount of lateral growth, which increases the effective size of the device and can cause electrical failures due to, e.g., source/drain shorts or N/P shorts. In this case, epitaxial growth causes the device to become so large that it interferes with other devices on the chip, resulting in malfunctions and a lower device yield.

In another technique, the fins are grown through an epitaxial process, but are left unmerged. Due to fin pitch walking and other process variations, however, some it is likely that some of the fins will merge and others will not, resulting in variations in the electrical properties of the devices from one device to the next. This can be addressed by limiting the amount of epitaxial growth to such a degree that no expected variations would cause fins to merge, but this leads to a much higher device resistance than is desirable.

SUMMARY

A method of forming a semiconductor device includes forming a first spacer on a plurality of fins. A second spacer is formed on the first spacer, the second spacer being formed from a different material from the first spacer. Gaps between the fins are filled with a support material. The first spacer and second spacer are polished to expose a top surface of the plurality of fins. All of the support material is etched away after polishing the first spacer and second spacer. The plurality of fins is etched below a bottom level of the first spacer to form a fin cavity. Material from the first spacer is removed to expand the fin cavity. Fin material is grown directly on the etched plurality of fins to fill the fin cavity.

A method of forming a semiconductor device includes forming a first spacer directly on a plurality of fins. A second spacer is formed directly on the first spacer, the second spacer being formed from a different material from the first spacer. Gaps between the fins are filled with a support material. The first spacer and second spacer are polished to expose a top surface of the plurality of fins. All of the support material is etched away after polishing the first spacer and second spacer. The plurality of fins is etched below a bottom level of the first spacer to form a fin cavity. Material from the first spacer is removed to expand the fin cavity. Fin material is grown directly on the etched plurality of fins to fill the fin cavity, such that the fin material does not merge.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide unmerged fin field effect transistors (FinFETs) having epitaxially grown regions that are constrained by a sidewall. The sidewalls prevent the fins from growing to contact one another, regardless of process variations, and helps maximize the size of the resulting fins. In this manner, the electrical benefits of larger fins can be maximized while reducing the likelihood of malfunction and increasing consistency between devices.

Figure 1:
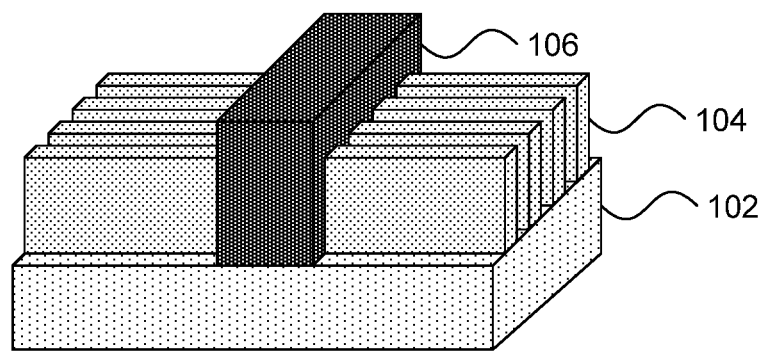
FIG. 1 is a perspective view of a fin field effect transistor (FinFET) in accordance with the present principles.

Referring now to the drawings in which like numerals represent the same or similar elements and initially to FIG. 1, an exemplary FinFET is shown. A set of semiconductor fins 104 are formed on a substrate 102. Any number of such fins 104 may be formed according to the needs of the designer. The substrate 102 may be any appropriate material, including for example bulk semiconductor or a semiconductor-on-insulator multi-layer substrate.

Materials suitable for the bulk-semiconductor substrate include, but are not limited to, silicon, silicon germanium, silicon germanium carbide, silicon carbide, polysilicon, epitaxial silicon, amorphous Si, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide.

Alternatively, a III-V compound semiconductor may be used. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of gallium arsenide, aluminum arsenide, indium gallium arsenide, indium aluminum arsenide, indium aluminum arsenic antimony, indium aluminum arsenic phosphorus, indium gallium arsenic phosphorus, and combinations thereof.

A set of semiconductor fins 104 are formed on the substrate 102. It should be noted that the semiconductor fins may be formed by any appropriate mechanism. In particular, it is envisioned that the fins 104 may be etched from the substrate 102 using, e.g., shallow trench isolation techniques and/or an anisotropic etch such as reactive ion etching. Alternatively, photolithography may be used to define the fins 104.

A gate structure 106 is formed over the fins 104. The gate structure 106 is specifically contemplated as being formed from polymorphous silicon, but it should be understood that any appropriate material may be used and may be formed by any appropriate process including, e.g., a replacement metal gate process where a dummy gate is formed initially and later replaced by a permanent metal gate. The portion of the fins 104 covered by the gate 106 represents a channel region, while portions of the fins 104 on either side of the gate 102 are source and drain regions respectively. Electrical connections are established with the gate 106 and the source/drain regions of the fins 104 to complete a transistor device.

Figure 2:
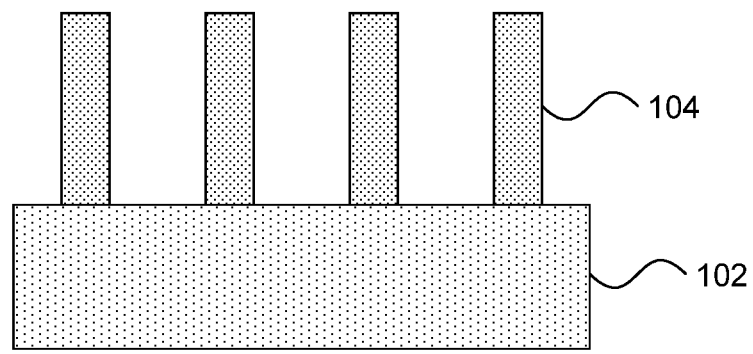
FIG. 2 is a cross-sectional view of a step in forming a FinFET in accordance with the present principles.

Referring now to FIG. 2, a cross-section of a first step in forming an unmerged, epitaxially grown fin FinFET is shown. The cross-section shown is perpendicular to the length of the fins 102 and in either the source or drain region of the fins, rather than in the channel region. As shown, the semiconductor fins 104 are formed on, or from, the semiconductor substrate 102. From this orientation, it is easy to see how the fins may be formed from a semiconductor layer by simply etching down. Alternatively, the material for the fins 104 may be grown or otherwise deposited on the substrate 102 and subsequently etched.

Figure 3:
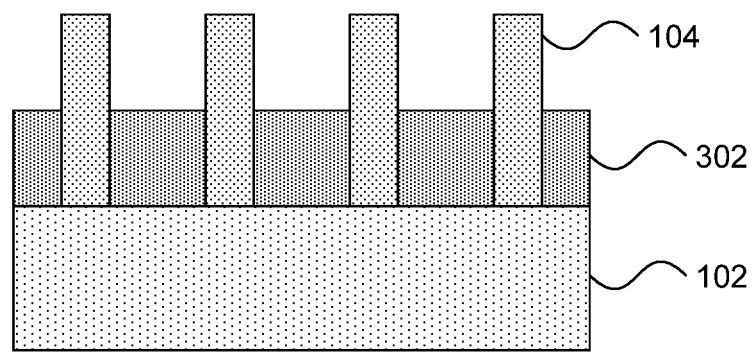
FIG. 3 is a cross-sectional view of a step in forming a FinFET in accordance with the present principles.

It should be noted that in one specific embodiment the gate 106 is formed over the fins 104 between the steps shown in FIG. 2 and FIG. 3. As such, the following steps are performed outside of the gate 106 and do not affect the channel portion of the fins 104 that is underneath the gate 106. It should be noted that the gate 106 may be formed by any appropriate process. The gate 106 may instead be a dummy gate, with the true gate to be formed after completing the fins.

Referring now to FIG. 3, a cross-section of a first step in forming an unmerged, epitaxially grown fin FinFET is shown. A dielectric 302 is formed between and around the fins 104. The dielectric 302 is formed from any suitable material including, e.g., silicon dioxide. The dielectric 302 provides electrical isolation between the fins 104 at the lower levels and may be formed to any desired depth or, alternatively, may be filled in over the fins 104 and subsequently etched down to the desired depth, leaving at least a top portion of the fins 110 exposed. Such an etch may include a timed wet etch or any other appropriate process.

Figure 4:
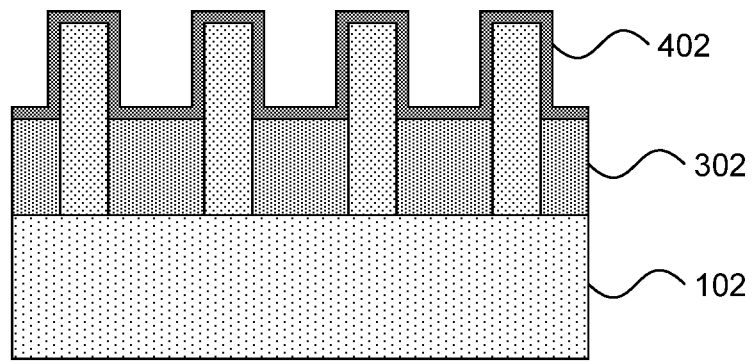
FIG. 4 is a cross-sectional view of a step in forming a FinFET in accordance with the present principles.

Referring now to FIG. 4, a cross-section of a first step in forming an unmerged, epitaxially grown fin FinFET is shown. A dielectric spacer 402 is formed conformally over the fins 104 and the dielectric layer 302. As used herein, the term "conformally" means that a "conformally formed" layer follows the contours of the underlying surface and that the layer in question has a consistent thickness, such that the shape of the underlying surface is evident in the layer that is formed.

The dielectric spacer 402 may be formed from any appropriate material including, e.g., silicon dioxide. Notably, the thickness of the dielectric spacer 402 is selected to determine the ultimate size of the fins after epitaxial growth. The dielectric spacer 402 may be formed using, e.g., chemical vapor deposition, atomic layer deposition, physical vapor deposition, or any other process that causes the spacer 402 to adhere to the sidewalls of the fins 402.

Figure 5:
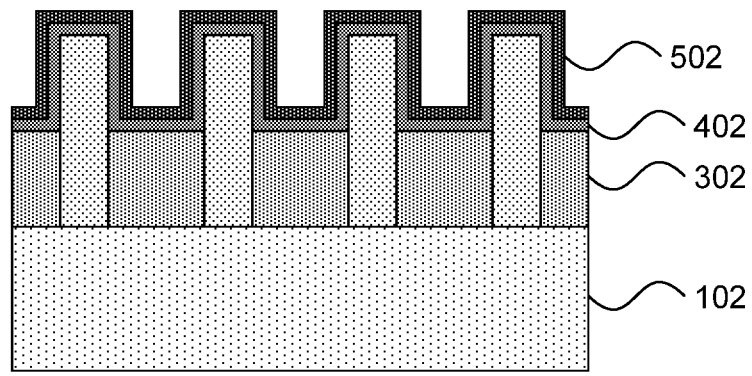
FIG. 5 is a cross-sectional view of a step in forming a FinFET in accordance with the present principles.

Referring now to FIG. 5, a cross-section of a first step in forming an unmerged, epitaxially grown fin FinFET is shown. A hardmask spacer 502 is conformally formed over the dielectric spacer 402. The hardmask spacer 502 is formed from a material that has etch selectivity with the dielectric spacer 402, such that the hardmask spacer 502 can be etched without affecting the dielectric spacer 402, with the reverse also being true. In one particular example, the hardmask spacer 502 may be formed from, e.g., silicon nitride.

Figure 6:
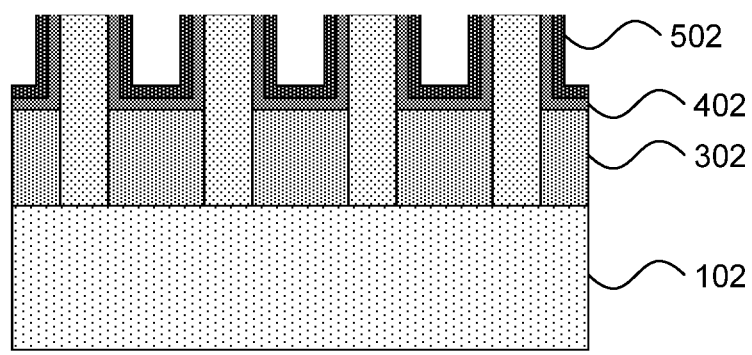
FIG. 6 is a cross-sectional view of a step in forming a FinFET in accordance with the present principles.

Referring now to FIG. 6, a cross-section of a first step in forming an unmerged, epitaxially grown fin FinFET is shown. The material of the dielectric spacer 402 and the hardmask 502 is removed from the top surface of the fins 104. This may be performed using, e.g., chemical mechanical planarization to physically remove this material without damaging the spacers on other surfaces. In particular, it is contemplated that a spin-on silicon dioxide layer may be deposited to fill the gaps between fins, followed by chemical-mechanical planarization to remove material from the dielectric layers and silicon dioxide until the top surfaces of the dielectrics are removed as shown. The remaining silicon dioxide is then removed using, e.g., diluted hydrogen fluoride processes. Notably, an anisotropic etch should not be used over the entire device, as doing so would remove material from the horizontal surface of the spacers over the dielectric layer 302. The top surface of the fins 104 is exposed by the chemical mechanical planarizing process.

Figure 7:
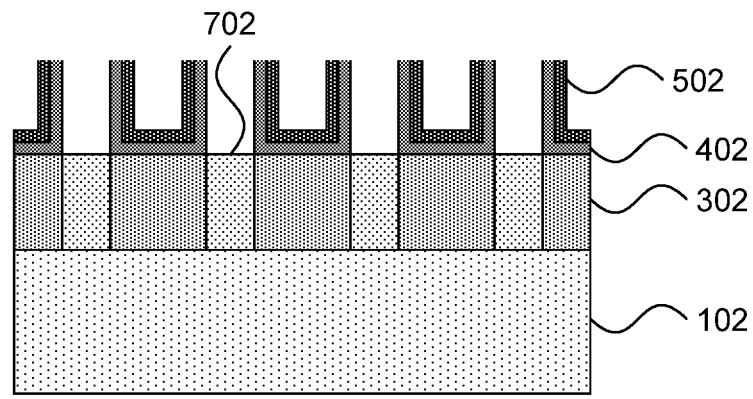
FIG. 7 is a cross-sectional view of a step in forming a FinFET in accordance with the present principles.

Referring now to FIG. 7, a cross-section of a first step in forming an unmerged, epitaxially grown fin FinFET is shown. The fins 104 are etched down to the level of the dielectric layer 302 using any appropriate etch. It is particularly contemplated that a selective reactive ion etch is used to remove only the semiconductor material of the fins 104 to produce buried fins 702. The dielectric layer 302 allows the fins 702 to be shortened without risking damage to the substrate 102. The dielectric spacers 402 and the hardmask spacers 502 over them remain on top of the dielectric layer 302. Removing material from the fins creates an initial fin cavity.

Figure 8:
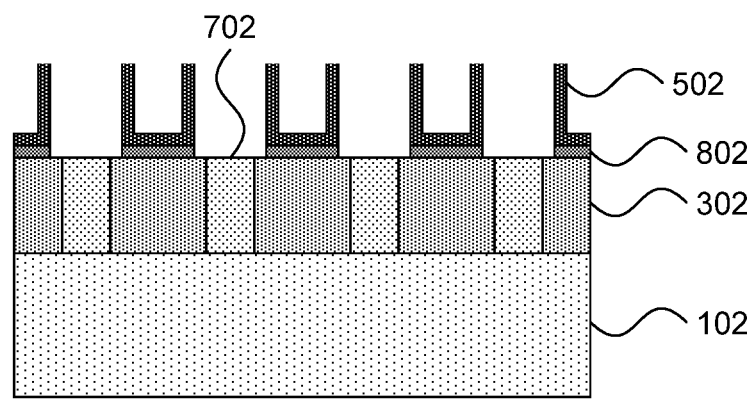
FIG. 8 is a cross-sectional view of a step in forming a FinFET in accordance with the present principles.

Referring now to FIG. 8, a cross-section of a first step in forming an unmerged, epitaxially grown fin FinFET is shown. The portion of the dielectric spacer 402 along the sidewalls of the hardmask spacer 502 is selectively removed, leaving only the portion of the dielectric spacer 802 that is beneath the hardmask spacer 502. As noted above, the thickness of the dielectric spacer 402 defines an additional space for the fins when the spacer material is removed, such that the removal of the material from the dielectric spacer 402 increases the size of the fin cavities. The material may be removed using, for example, a reactive ion etch that is selective to the underlying semiconductor materials and the hardmask spacer 502. This results in hardmask spacers 502 that have a 'u'-shaped cross section that define the location and size of the fin cavities around the exposed tops of the buried fins 702.

Figure 9:
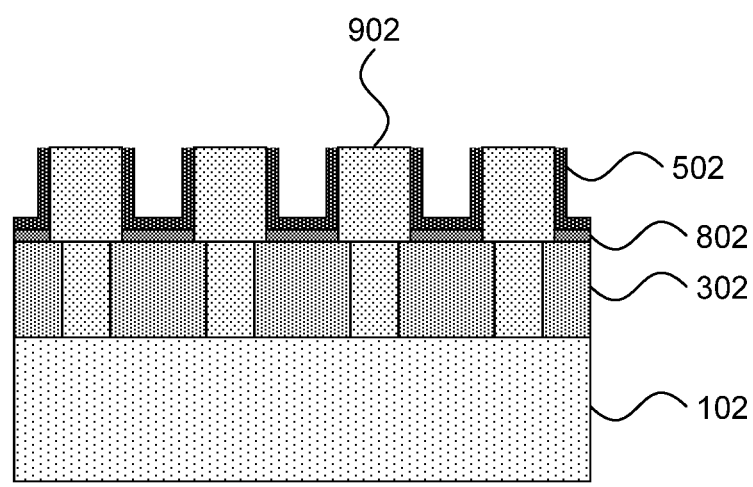
FIG. 9 is a cross-sectional view of a step in forming a FinFET in accordance with the present principles.

Referring now to FIG. 9, a cross-section of a first step in forming an unmerged, epitaxially grown fin FinFET is shown. In this step, the fins 702 are used as a seed for epitaxial growth of additional semiconductor material to extend the fins 902. The epitaxially grown material 902 occupies the space left by the removed spacer material. As can be seen, the larger the dielectric spacer 402 is, the larger the epitaxially grown material 902 can become. The growth of the material 902 is constrained by the sidewalls of the hardmask spacer 502. As a result, the fins 902 can be made arbitrarily large while still preventing them from merging with one another. In one specific example, the final width of the fins 902 can be about 10 nm to about 20 nm in a 7 nm node process. The minimum spacing between fins 902 can be about 5 nm to about 10 nm. Thus, the benefits of larger semiconductor fins can be obtained without risking the drawbacks of merging the fins.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 10:
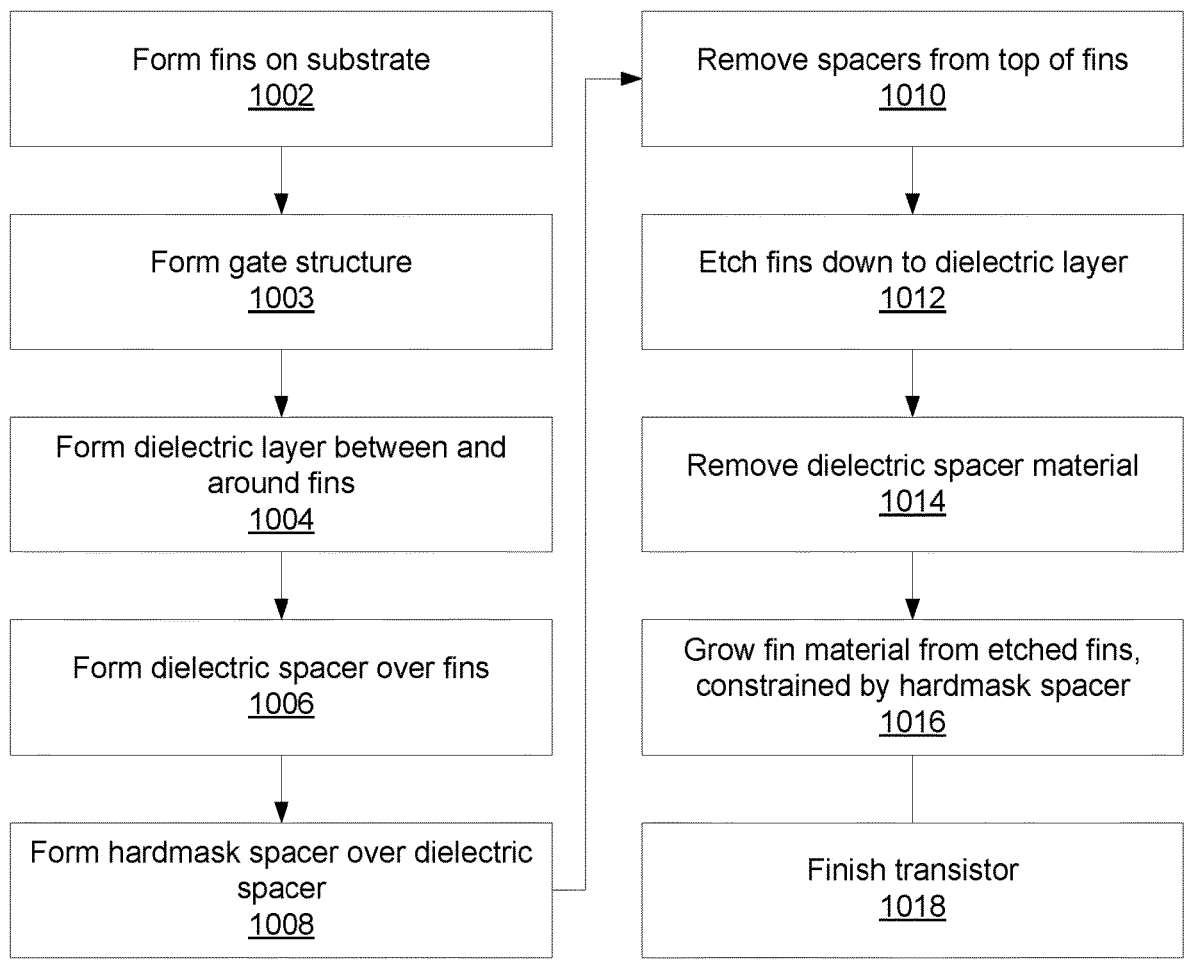
FIG. 10 is a block/flow diagram of a method of forming a FinFET in accordance with the present principles.

Referring now to FIG. 10, a method for forming an unmerged, epitaxially grown fin FinFET is shown. Block 1002 forms fins 104 on the substrate 102. As noted above, this step can be performed by any appropriate process including, e.g., shallow trench isolation, photolithography, or an anisotropic etch. A gate structure 106 is formed over the fins 104 in block 1003. As noted above, this may be the final gate structure or may instead represent a dummy gate that is later replaced by a final gate structure. Block 1004 forms a dielectric layer 302 between and around the fins 104 using a flowable oxide process that may include, e.g., silicon dioxide.

Block 1006 conformally forms a dielectric spacer 402 over the fins 104 with a material such as, e.g., silicon dioxide. Block 1008 then conformally forms a hardmask spacer 502 over the dielectric spacer 402, resulting in a two-layer spacer over each of the fins. Block 1010 removes the spacer layers from the top surfaces of the fins 104, exposing the fin material.

Block 1012 etches the fins 104 down to the level of the dielectric layer 302, leaving the spacers 402 and 502 in place. Block 1014 then removes material from the dielectric spacer 402 along the sidewalls of the hardmask spacers 502, thereby increasing the size of the fin cavity. Block 1016 grows additional fin material from the top surfaces of the etched fins 702, filling the fin cavity defined by the sidewalls of the hardmask spacer 502.

Block 1018 then finishes the transistor device. If a dummy gate was used, block 1018 replaces the gate with a final gate structure such as, e.g., a metal gate 106. A passivating dielectric layer may be deposited over the entire device to prevent inadvertent electrical communication between the fins 104 and other structures. Conductive contacts may be formed in the passivating layer to provide electrical access to the fins 902 and to the gate 106.

Having described preferred embodiments of an unmerged epitaxial process for FinFET devices with aggressive fin pitch scaling (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a semiconductor device, comprising:
   forming a first spacer on a plurality of fins;
   forming a second spacer on the first spacer, the second spacer being formed from a different material from the first spacer;
   filling gaps between the fins with a support material;
   polishing the first spacer and second spacer to expose a top surface of the plurality of fins;
   etching away all of the support material after polishing the first spacer and second spacer;
   etching the plurality of fins below a bottom level of the first spacer to form a fin cavity;
   removing material from the first spacer to expand the fin cavity; and
   growing fin material directly on the etched plurality of fins to fill the fin cavity.

2. The method of claim 1, wherein removing material from the first and second spacer comprises removing only material that is above the plurality of fins, such that material between the fins is not removed.

3. The method of claim 1, further comprising forming a dielectric layer between and around the plurality of fins before forming the first spacer to electrically isolate the plurality of fins.

4. The method of claim 3, wherein etching the plurality of fins comprises etching the plurality of fins below a top level of the dielectric layer.

5. The method of claim 1, wherein growing fin material is limited such that the fins do not merge.

6. The method of claim 1, further comprising forming the plurality of fins on a substrate.

7. The method of claim 1, further comprising forming a gate over a channel region of the fins, such that spacers and grown fin material are formed only on source and drain regions of the fins.

8. The method of claim 1, wherein the first spacer is formed directly on the plurality of fins.

9. The method of claim 1, wherein the second spacer is formed directly on the first spacer.

10. The method of claim 1, wherein the first spacer and the second spacer are polished before etching the plurality of fins.

11. The method of claim 1, wherein filling gaps between the fins comprises spin-on deposition of silicon dioxide and wherein etching away the support material comprises an etch using dilute hydrogen fluoride.

12. A method for forming a semiconductor device, comprising:
    forming a first spacer directly on a plurality of fins;
    forming a second spacer directly on the first spacer, the second spacer being formed from a different material from the first spacer;
    filling gaps between the fins with a support material;
    polishing the first spacer and second spacer to expose a top surface of the plurality of fins;
    etching away all of the support material after polishing the first spacer and second spacer;
    etching the plurality of fins below a bottom level of the first spacer to form a fin cavity;
    removing material from the first spacer to expand the fin cavity; and
    growing fin material directly on the etched plurality of fins to fill the fin cavity, such that the fin material does not merge.

13. The method of claim 12, wherein removing material from the first and second spacer comprises removing only material that is above the plurality of fins, such that material between the fins is not removed.

14. The method of claim 12, further comprising forming a dielectric layer between and around the plurality of fins before forming the first spacer to electrically isolate the plurality of fins.

15. The method of claim 14, wherein etching the plurality of fins comprises etching the plurality of fins below a top level of the dielectric layer.

16. The method of claim 12, further comprising forming the plurality of fins on a substrate.

17. The method of claim 12, further comprising forming a gate over a channel region of the fins, such that spacers and grown fin material are formed only on source and drain regions of the fins.

* * * * *